United States Patent
Sung et al.

(10) Patent No.: US 12,211,766 B2
(45) Date of Patent: Jan. 28, 2025

(54) HIGHLY PROTECTIVE WAFER EDGE SIDEWALL PROTECTION LAYER

(71) Applicant: Taiwan Semiconductor Manufacturing Co., Ltd., Hsinchu (TW)

(72) Inventors: Su-Jen Sung, Zhubei (TW); Jr-Hung Li, Chupei (TW); Tze-Liang Lee, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 412 days.

(21) Appl. No.: 17/657,184

(22) Filed: Mar. 30, 2022

(65) Prior Publication Data
US 2023/0178446 A1    Jun. 8, 2023

Related U.S. Application Data

(60) Provisional application No. 63/286,620, filed on Dec. 7, 2021.

(51) Int. Cl.
*H01L 23/31* (2006.01)
*H01L 21/56* (2006.01)
(Continued)

(52) U.S. Cl.
CPC .......... *H01L 23/3185* (2013.01); *H01L 21/56* (2013.01); *H01L 23/291* (2013.01); *H01L 23/3192* (2013.01); *H01L 23/5386* (2013.01); *H01L 24/08* (2013.01); *H01L 24/16* (2013.01); *H01L 24/32* (2013.01); *H01L 24/73* (2013.01); *H01L 24/80* (2013.01); *H01L 24/48* (2013.01); *H01L 25/105* (2013.01); *H01L 2224/08148* (2013.01); *H01L 2224/16227* (2013.01);
(Continued)

(58) Field of Classification Search
CPC . H01L 23/3185; H01L 21/56; H01L 23/5386; H01L 24/08; H01L 24/32; H01L 24/73; H01L 24/80; H01L 25/105; H01L 2224/08148; H01L 2224/16237; H01L 2224/32225; H01L 2224/48229
See application file for complete search history.

(56) References Cited

U.S. PATENT DOCUMENTS 9,768,089 B2 *   9/2017   Rajoo ................. H01L 21/6835
11,152,276 B2   10/2021   Li et al.
(Continued)

FOREIGN PATENT DOCUMENTS

TW       202119510 A     5/2021

*Primary Examiner* — Mamadou L Diallo
(74) *Attorney, Agent, or Firm* — Slater Matsil, LLP

(57) ABSTRACT

A method includes bonding a first wafer to a second wafer, performing a trimming process on the first wafer, and depositing a sidewall protection layer contacting a sidewall of the first wafer. The depositing the sidewall protection layer includes depositing a high-density material in contact with the sidewall of the first wafer. The sidewall protection layer has a density higher than a density of silicon oxide. The method further includes removing a horizontal portion of the sidewall protection layer that overlaps the first wafer, and forming an interconnect structure over the first wafer. The interconnect structure is electrically connected to integrated circuit devices in the first wafer.

20 Claims, 17 Drawing Sheets

(51) Int. Cl.
*H01L 23/00* (2006.01)
*H01L 23/29* (2006.01)
*H01L 23/538* (2006.01)
*H01L 25/10* (2006.01)

(52) U.S. Cl.
CPC ............... *H01L 2224/16237* (2013.01); *H01L 2224/32225* (2013.01); *H01L 2224/48229* (2013.01); *H01L 2224/73204* (2013.01); *H01L 2224/73265* (2013.01); *H01L 2224/80895* (2013.01); *H01L 2224/80896* (2013.01); *H01L 2225/1041* (2013.01)

(56) References Cited

U.S. PATENT DOCUMENTS

| | | | |
|---|---|---|---|
| 11,842,979 B2 * | 12/2023 | Lo | H01L 25/0657 |
| 2016/0343629 A1 | 11/2016 | Rajoo et al. | |
| 2021/0134694 A1 * | 5/2021 | Li | H01L 21/76898 |
| 2021/0313309 A1 * | 10/2021 | Chen | H01L 24/05 |

* cited by examiner

HIGHLY PROTECTIVE WAFER EDGE SIDEWALL PROTECTION LAYER

PRIORITY CLAIM AND CROSS-REFERENCE

This application claims the benefit of the following provisionally filed U.S. patent application: Application No. 63/286,620, filed on Dec. 7, 2021, and entitled "Wafer Edge Trimmed Sidewall Protection Layer," which application is hereby incorporated herein by reference.

BACKGROUND

Carrier wafers are commonly used in the packaging of integrated circuits as a supporting mechanism. For example, when forming a device wafer with through-vias penetrating through a substrate of the device wafer, the device wafer is bonded to a carrier wafer, so that the device wafer may be thinned, and electrical connectors may be formed on the backside of the substrate.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
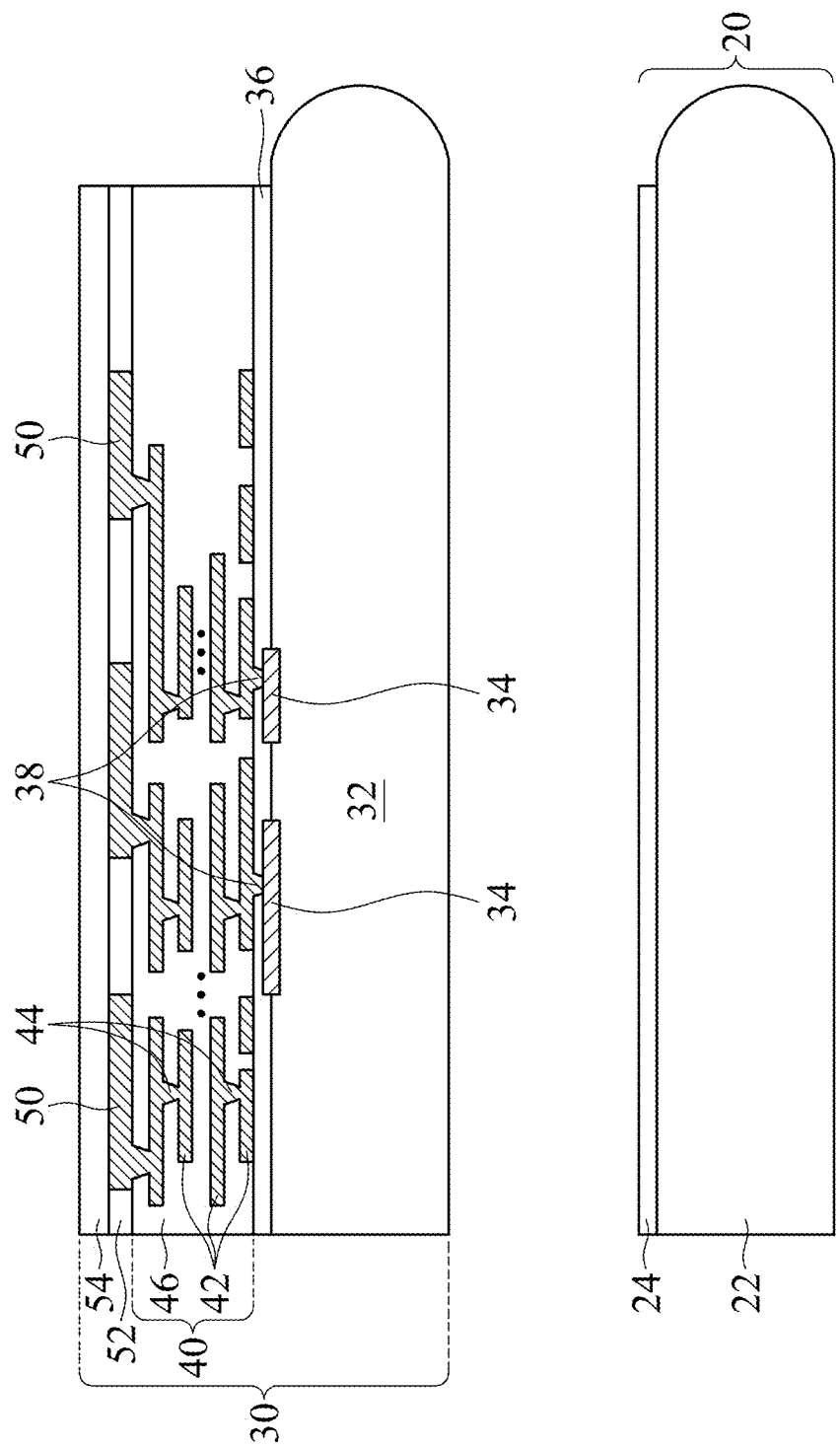
FIGS. 1-11 illustrate the intermediate stages in a wafer bonding process and the formation of a package in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A wafer bonding process and the formation of a package are provided. In accordance with some embodiments of the present disclosure, a device wafer is bonded to a carrier wafer. The device wafer is thinned, followed by an edge trimming process. A sidewall protection layer is formed on the sidewall of the device wafer. In accordance with some embodiments, the sidewall protection layer is formed using a high-density material, which has higher density than silicon oxide. The high-density material has good blocking ability for preventing detrimental chemicals and moisture from penetrating through. With the using of the high-density sidewall protection layer, the degradation to the low-k dielectric layers and metal features in the low-k dielectric layers in the device wafer is reduced, and the device degradation is avoided. The Embodiments discussed herein are to provide examples to enable making or using the subject matter of this disclosure, and a person having ordinary skill in the art will readily understand modifications that can be made while remaining within contemplated scopes of different embodiments. Throughout the various views and illustrative embodiments, like reference numbers are used to designate like elements. Although method embodiments may be discussed as being performed in a particular order, other method embodiments may be performed in any logical order.

FIGS. 1-11 illustrate the cross-sectional views of intermediate stages in the bonding of a device wafer to a carrier wafer, and the formation of backside interconnect structure on the backside of the device wafer in accordance with some embodiments of the present disclosure. The corresponding processes are also reflected schematically in the process flow shown in FIG. 17.

Referring to FIG. 1, wafer 20 is formed. In accordance with some embodiments, wafer 20 is a carrier wafer, and hence is referred to as carrier wafer 20 hereinafter. Carrier wafer 20 may have a round top view shape. In accordance with some embodiments, carrier wafer 20 includes substrate 22. Substrate 22 may be formed of a same material as the substrate 32 in device wafer 30 (discussed subsequently), so that in the subsequent packaging process, the warpage due to the mismatch of Coefficients of Thermal Expansion (CTE) values between carrier wafer 20 and device wafer 30 is reduced. Substrate 22 may be formed of or comprise silicon, while other materials such as ceramic, glass, silicate glass, or the like, may also be used. In accordance with some embodiments, the entire substrate 22 is formed of a homogeneous material, with no other material different from the homogeneous material therein. For example, the entire carrier wafer 20 may be formed of silicon (doped or undoped), and there is no metal region, dielectric region, etc., therein.

In accordance with alternative embodiments, wafer 20 is a device wafer including active devices (such as transistors) and/or passive devices (such as capacitors, resistors, inductors, and/or the like) therein. Wafer 20, when being a device wafer, may be an un-sawed wafer including a semiconductor substrate continuously extending into all device dies in the wafer, or may be a reconstructed wafer including discrete device dies that are packaged in an encapsulant (such as a molding compound).

Figure 17:
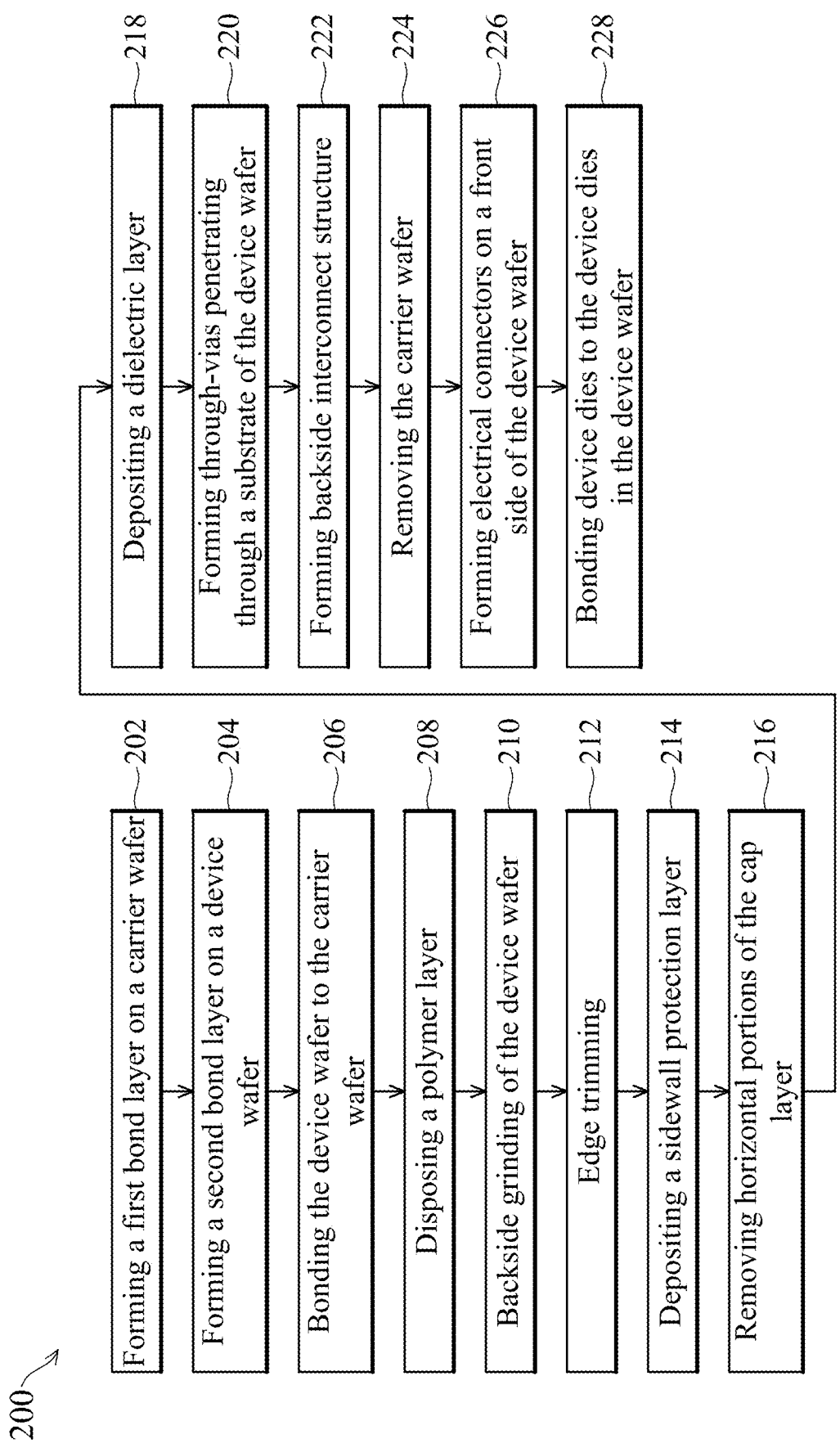
FIG. 17 illustrates a process flow of a wafer bonding process and the formation of a package in accordance with some embodiments.

Bond layer 24 is deposited on substrate 22. The respective process is illustrated as process 202 in the process flow 200 as shown in FIG. 17. In accordance with some embodiments, bond layer 24 is formed of or comprises a dielectric material, which may be a silicon-based dielectric material such as silicon oxide ($SiO_2$), SiN, SiON, SiOCN, SiC, SiCN, or the like, or combinations thereof. In accordance with some embodiments, bond layer 24 has a thickness in a range between about 1000 Å and about 10,000 Å.

In accordance with some embodiments of the present disclosure, bond layer 24 is formed using High-Density Plasma Chemical Vapor Deposition (HDPCVD), Plasma Enhanced Chemical Vapor Deposition (PECVD), Chemical Vapor Deposition (CVD), Low-Pressure Chemical Vapor Deposition (LPCVD), Atomic Layer deposition (ALD), or the like.

In accordance with some embodiments, bond layer 24 is in physical contact with substrate 22. In accordance with alternative embodiments, carrier wafer 20 includes a plurality of layers (not shown) between bond layer 24 and substrate 22. For example, there may be an oxide-based layer formed of an oxide-based material (which may also be silicon oxide based) such as silicon oxide, phospho-silicate glass (PSG), borosilicate glass (BSG), boron-doped phospho silicate glass (BPSG), fluorine-doped silicate glass (FSG), or the like. There may also be a nitride-based layer formed of or comprising silicon nitride, while it may also be formed of or comprise other materials such as silicon oxynitride (SiON). In accordance with some embodiments of the present disclosure, the layers between substrate 22 and bond layer 24 may be formed using PECVD, CVD, LPCVD, ALD, or the like. There may also be alignment marks formed between bond layer 24 and substrate 22. The alignment marks may be formed as metal plugs, which may be formed through damascene processes.

Figure 2:
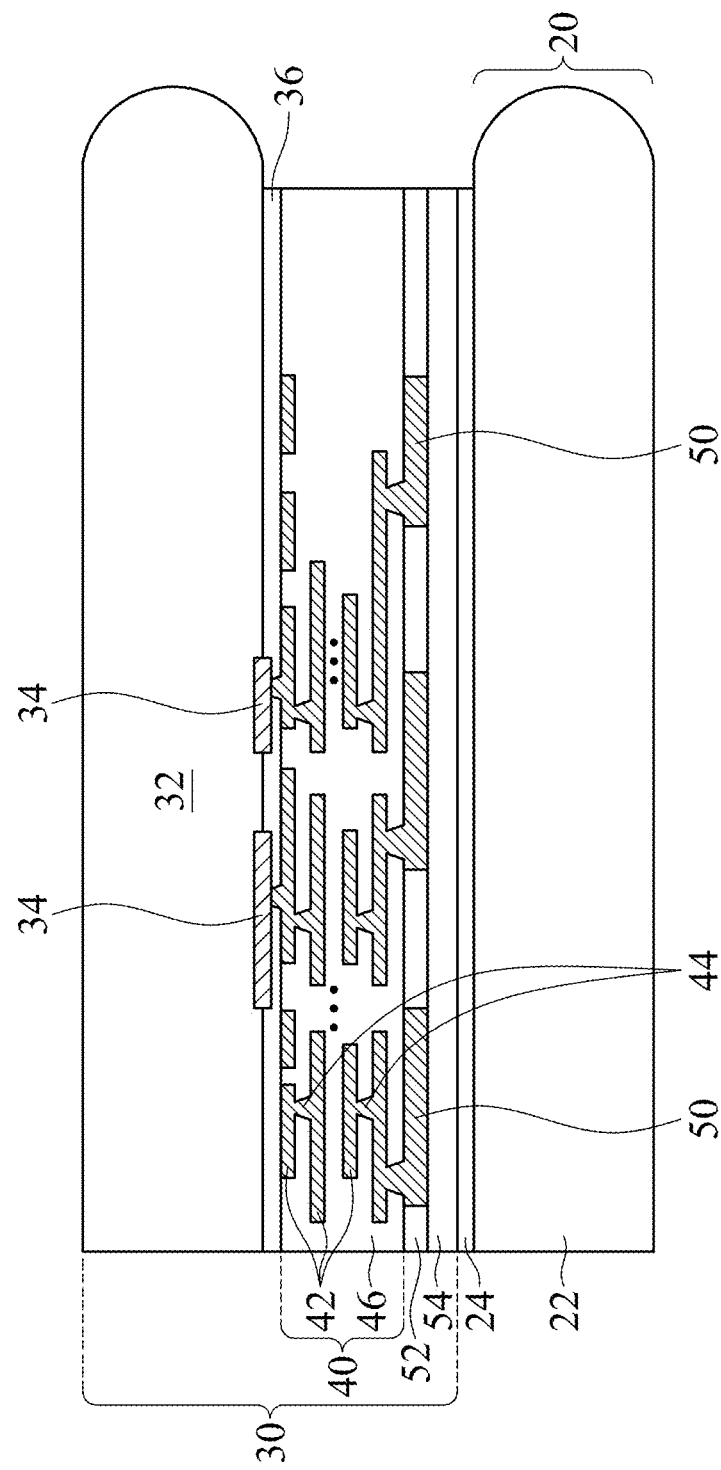
Figure 8:
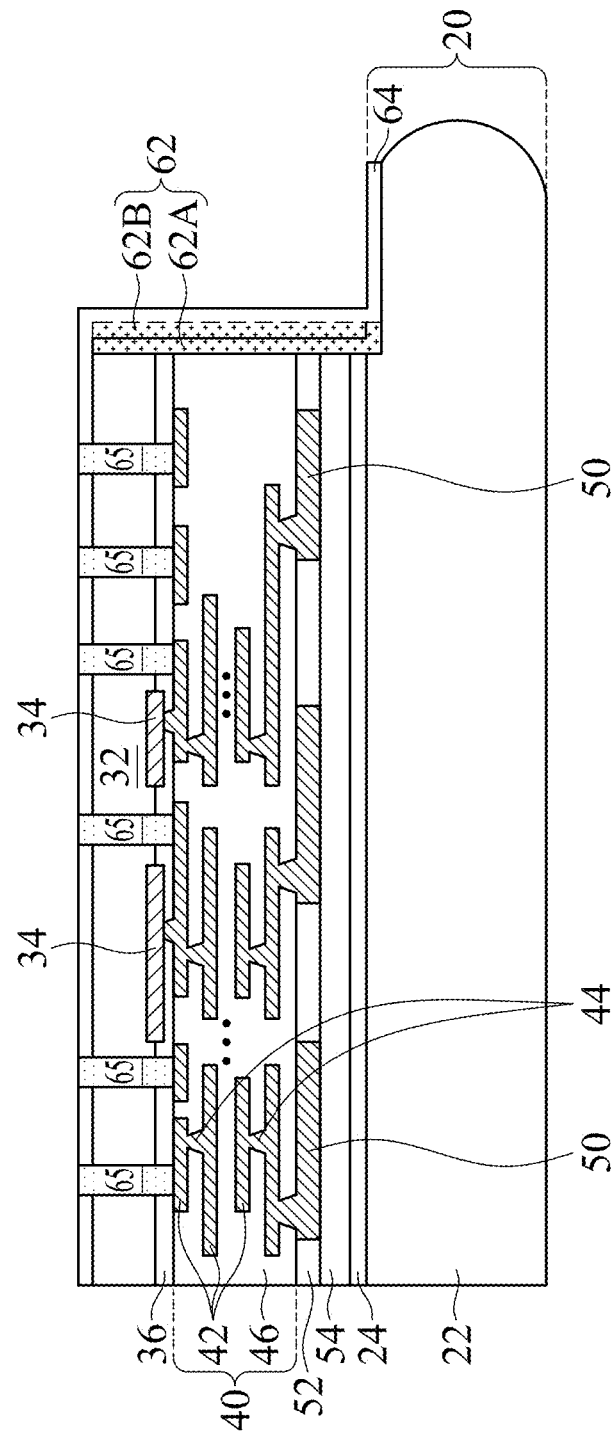

Further referring to FIG. 1, device wafer 30 is formed. device wafer 30 may be an un-sawed wafer, and the bonding process as shown in FIG. 2 is a wafer-to-wafer bonding process. In accordance with some embodiments, device wafer 30 includes substrate 32. There may be through-substrate vias (not shown) extending from the front side (the illustrated top side) into substrate 32. In accordance with alternative embodiments, no through-vias are formed at this stage, and the through-vias are formed in the process as shown in FIG. 8. Substrate 32 may be a semiconductor substrate such as a silicon substrate. In accordance with other embodiments, substrate 32 may include other semiconductor materials such as silicon germanium, carbon-doped silicon or the like. Substrate 32 may be a bulk substrate, or may have a layered structure, for example, including a silicon substrate and a silicon germanium layer over the silicon substrate.

In accordance with some embodiments, device wafer 30 includes device dies, which may include logic dies, memory dies, input-output dies, Integrated Passive Devices (IPDs), or the like, or combinations thereof. For example, the logic device dies in device wafer 30 may be Central Processing Unit (CPU) dies, Graphic Processing Unit (GPU) dies, mobile application dies, Micro Control Unit (MCU) dies, BaseBand (BB) dies, Application processor (AP) dies, or the like. The memory dies in device wafer 30 may include Static Random-Access Memory (SRAM) dies, Dynamic Random-Access Memory (DRAM) dies, or the like. Device wafer 30 may be a simple device wafer including a semiconductor substrate extending continuously throughout device wafer 30, or may be a reconstructed wafer including device dies packaged therein, System-on-Chip (SoC) dies including a plurality of integrated circuits (or device dies) integrated as a system, or the like.

In accordance with some embodiments of the present disclosure, integrated circuit devices 34 are formed on the top surface of semiconductor substrate 32. Example integrated circuit devices 34 may include Complementary Metal-Oxide Semiconductor (CMOS) transistors, resistors, capacitors, diodes, and/or the like. The details of integrated circuit devices 34 are not illustrated herein. In accordance with alternative embodiments, device wafer 30 is used for forming interposers, in which substrate 32 may be a semiconductor substrate or a dielectric substrate.

Inter-Layer Dielectric (ILD) 36 is formed over semiconductor substrate 32 and fills the space between the gate stacks of transistors (not shown) in integrated circuit devices 34. In accordance with some example embodiments, ILD 36 is formed of or comprises silicon oxide, Phospho Silicate Glass (PSG), Boro Silicate Glass (BSG), Boron-Doped Phospho Silicate Glass (BPSG), Fluorine-Doped Silicate Glass (FSG), or the like. ILD 36 may be formed using spin coating, Flowable Chemical Vapor Deposition (FCVD), Chemical Vapor Deposition (CVD), or the like. In accordance with some embodiments of the present disclosure, ILD 36 is formed using a deposition method such as PECVD, LPCVD, or the like.

Contact plugs 38 are formed in ILD 36, and are used to electrically connect integrated circuit devices 34 to overlying metal lines and vias. In accordance with some embodiments of the present disclosure, contact plugs 38 are formed of a conductive material selected from tungsten, aluminum, copper, titanium, tantalum, titanium nitride, tantalum nitride, alloys therefore, and/or multi-layers thereof. The formation of contact plugs 38 may include forming contact openings in ILD 36, filling a conductive material(s) into the contact openings, and performing a planarization process (such as a Chemical Mechanical Polish (CMP) process) to level the top surfaces of contact plugs 38 with the top surface of ILD 36.

Over ILD 36 and contact plugs 38 resides interconnect structure 40. Interconnect structure 40 includes metal lines 42 and vias 44, which are formed in dielectric layers 46. Dielectric layers 46 may include Inter-Metal Dielectric (IMD) layers 46 hereinafter. In accordance with some embodiments of the present disclosure, some of dielectric layers 46 are formed of low-k dielectric materials having dielectric constant values (k-values) lower than about 3.0. Dielectric layers 46 may be formed of or comprise a carbon-containing low-k dielectric material, Hydrogen SilsesQuioxane (HSQ), MethylSilsesQuioxane (MSQ), or the like. In accordance with some embodiments of the present disclosure, the formation of dielectric layers 46 includes depositing a porogen-containing dielectric material, and then performing a curing process to drive out the porogen, and hence the remaining dielectric layers 46 are porous. In accordance with alternative embodiments of the present disclosure, some or all of dielectric layers 46 are formed of non-low-k dielectric materials such as silicon oxide, silicon carbide (SiC), silicon carbo-nitride (SiCN), silicon oxy-carbo-nitride (SiOCN), or the like. Etch stop layers (not shown), which may be formed of silicon carbide, silicon nitride, silicon oxynitride, aluminum oxide, aluminum nitride, or the like, or multi-layers thereof, are formed between dielectric layers 46, and are not shown for simplicity.

Metal lines 42 and vias 44 are formed in dielectric layers 46. The metal lines 42 at a same level are collectively referred to as a metal layer hereinafter. In accordance with some embodiments of the present disclosure, interconnect structure 40 includes a plurality of metal layers that are interconnected through vias 44. The number of IMD layers is determined based upon the routing requirement. For example, there may be between 5 and 15 IMD layers.

Metal lines 42 and vias 44 may be formed of copper or copper alloys, and they can also be formed of other metals. The formation process may include single damascene processes and dual damascene processes. In an example single damascene process, a trench is first formed in one of dielectric layers 46, followed by filling the trench with a conductive material(s). A planarization process such as a CMP process is then performed to remove the excess portions of the conductive material(s) higher than the top surface of the IMD layer, leaving a metal line in the trench. In a dual damascene process, both a trench and a via opening are formed in an IMD layer, with the via opening underlying and connected to the trench. The conductive material(s) is then filled into the trench and the via opening to form a metal line and a via, respectively. The conductive material(s) may include a diffusion barrier layer and a copper-containing metallic material over the diffusion barrier layer. The diffusion barrier layer may include titanium, titanium nitride, tantalum, tantalum nitride, or the like.

Dielectric layers 46 may further include passivation layers over the low-k dielectric layers. For example, there may be undoped silicate-glass (USG) layers, silicon oxide layers, silicon nitride layers, etc., over the damascene metal lines 42 and vias 44. The passivation layers are denser than the low-k dielectric layers, and have the function of isolating the low-k dielectric layers from detrimental chemicals and gases such as moisture.

In accordance with some embodiments, there may be top metal pads 50 formed over interconnect structure 40, and electrically connecting to integrated circuit devices 34 through metal lines 42 and vias 44. The top metal pads 50 are formed in dielectric layer 46. The top metal pads 50 may be formed of or comprises copper, nickel, titanium, palladium, or the like, or alloys thereof. In accordance with some embodiments, top metal pads 50 are in a passivation layer 52. In accordance with alternative embodiments, a polymer layer (which may be polyimide, polybenzoxazole (PBO), or the like) may be formed, with the top metal pads 50 being in the polymer layer.

Bond layer 54 is deposited on the top of device wafer 30, and hence is a top surface layer of device wafer 30. The respective process is illustrated as process 204 in the process flow 200 as shown in FIG. 17. Bond layer 54 may be formed of a material selected from the same group of candidate materials for forming bond layer 24. For example, bond layer 54 may be selected from silicon oxide ($SiO_2$), SiN, SiON, SiOCN, SiC, SiCN, or the like, or combinations thereof. The material of bond layers 24 and 54 may be the same as each other or different from each other. In accordance with some embodiments, bond layer 54 has a thickness in a range between about 1,000 Å and about 10,000 Å.

Referring to FIG. 2, device wafer 30 is flipped upside down, and bonded to carrier wafer 20, with bond layer 54 bonding to bond layer 24. The bonding may be performed through fusion bonding, for example, with Si—O—Si bonds formed to join carrier wafer 20 with device wafer 30. The respective process is illustrated as process 206 in the process flow 200 as shown in FIG. 17. In accordance with some embodiments, the bonding of device wafer 30 to carrier wafer 20 includes pre-treating bond layers 24 and 54 in a process gas comprising oxygen ($O_2$) and/or nitrogen ($N_2$), performing a pre-bonding process to join bond layers 24 and 54 together, and performing an annealing process following the pre-bonding process. In accordance with some embodiments, during the pre-bonding process, device wafer 30 is put into contact with carrier wafer 20, with a pressing force applied to press device wafer 30 against carrier wafer 20.

After the pre-bonding process, an annealing process is performed. Si—O—Si bonds may be formed to join bond layers 24 and 54 together, so that bond layers 24 and 54 are bonded to each other with high bonding strength. In accordance with some embodiments, the annealing process is performed at a temperature between about 250° C. and about 400° C. The annealing duration may be in the range between about 30 minutes and about 60 minutes. In accordance with some embodiments, as shown in FIG. 2, device wafer 30 is over and bonded to the underlying carrier wafer 20. In accordance with alternative embodiments, device wafer 30 is underlying and bonded to the overlying carrier wafer 20, and after the bonding, the bonded structure is flipped, and the resulting structure is shown in FIG. 2.

Figure 3:
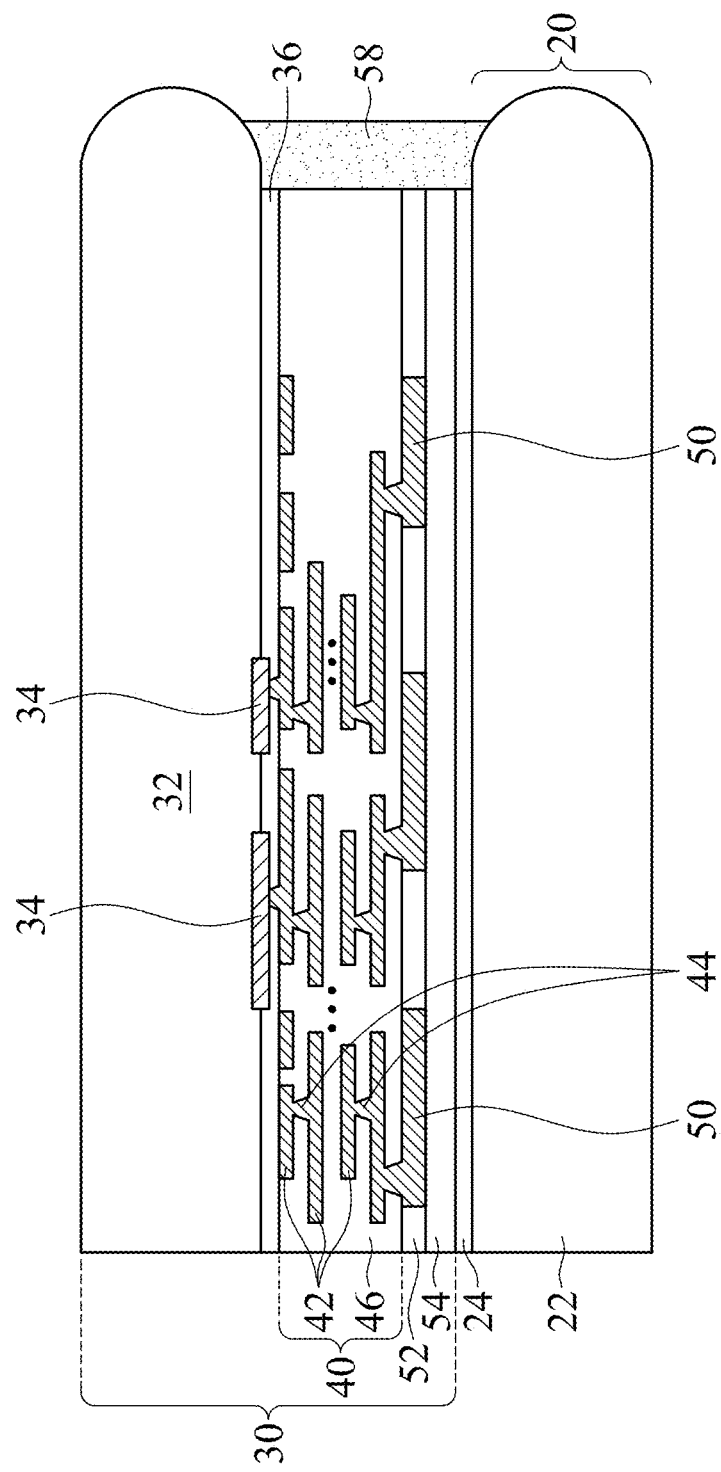

Referring to FIG. 3, a polymer layer 58 is dispensed into the gap between substrate 22 and substrate 32, and on the sidewalls of interconnect structure 40. The respective process is illustrated as process 208 in the process flow 200 as shown in FIG. 17. In accordance with some embodiments, polymer layer 58 is formed of or comprises polyimide, PBO, or the like. Polymer layer 58 is dispensed in a flowable form, and is then cured and solidified. Furthermore, polymer layer 58 is dispensed as a ring fully encircling the region between substrate 22 and substrate 32.

Figure 4:
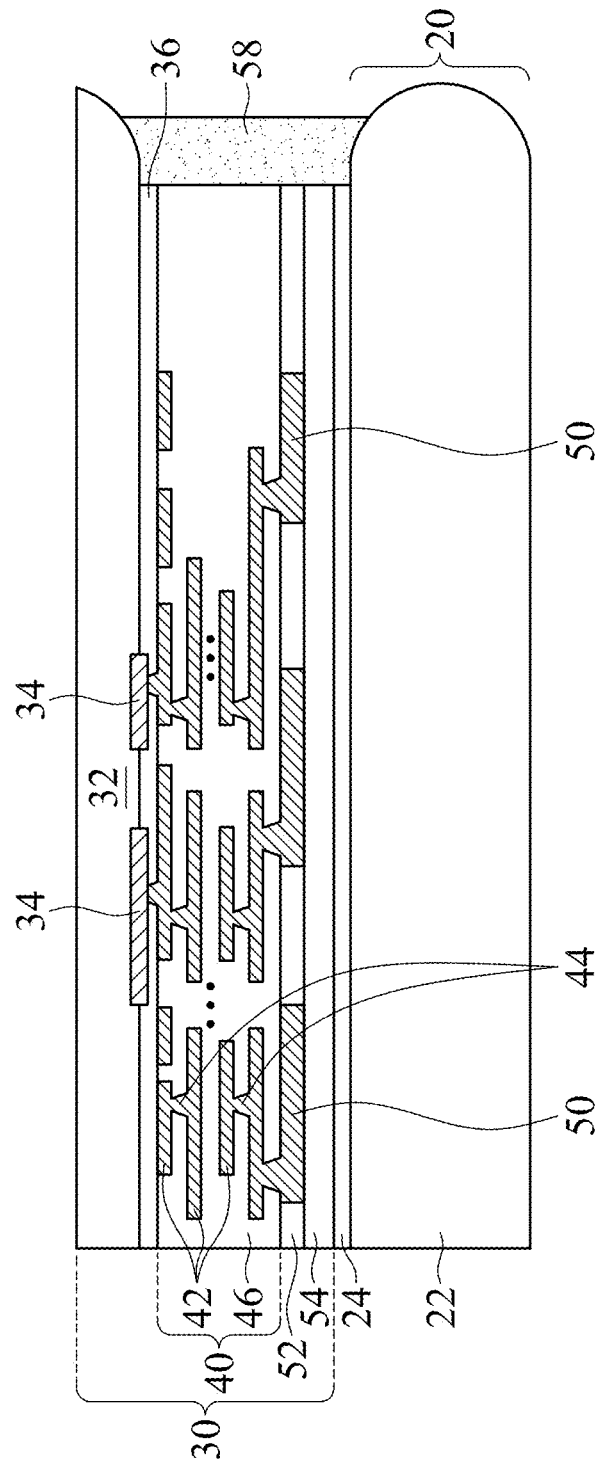

Referring to FIG. 4, a backside grinding process is performed from the backside of device wafer 30, and substrate 32 is thinned. The respective process is illustrated as process 210 in the process flow 200 as shown in FIG. 17. The backside grinding process may be performed through a CMP process or a mechanical polishing process. In the backside grinding process, polymer layer 58 has the function of preventing device wafer 30 from peeling off from carrier wafer 20. In addition, the grinding process and subsequent cleaning processes may involve the using of water, and polymer layer 58 can block moisture from penetrating into interconnect structure 40 from the sidewalls of dielectric layers 46, and may prevent the degradation of the dielectric layers and the metal features in device wafer 30.

Figure 5:
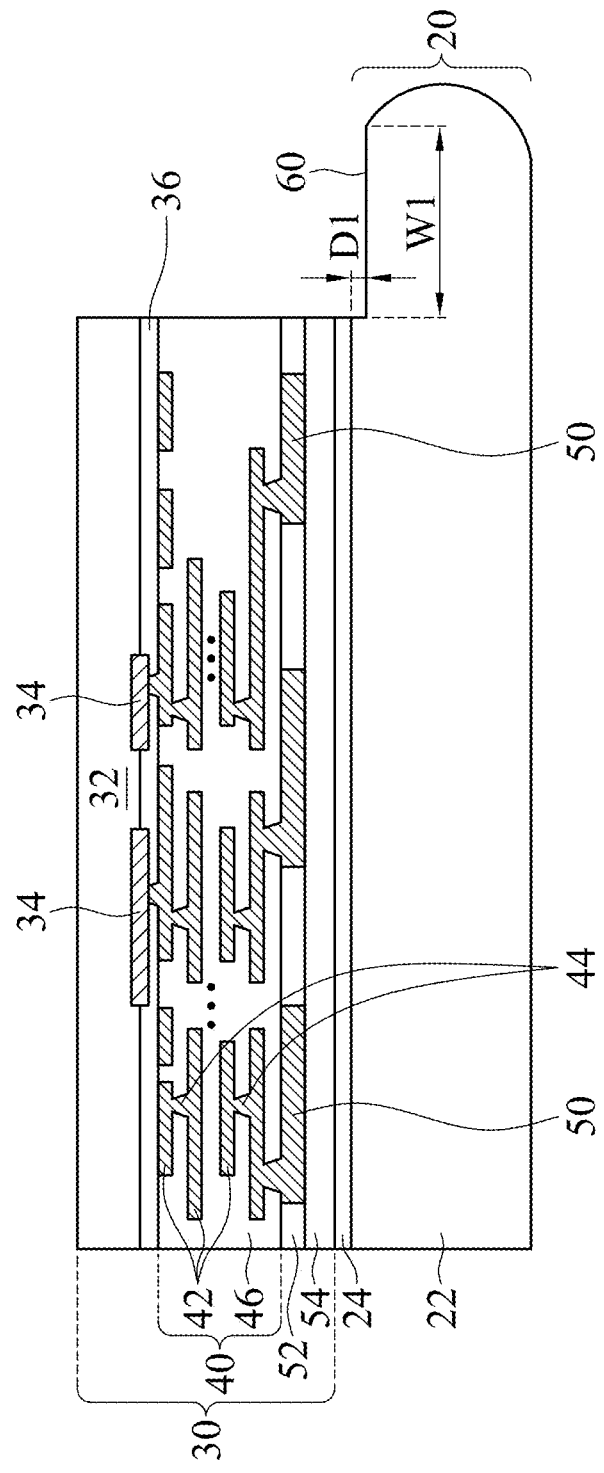

An edge trimming process is then performed to remove polymer layer 58 and the edge portions of device wafer 30. Some edge portions of carrier wafer 20 may also be removed. The respective process is illustrated as process 212 in the process flow 200 as shown in FIG. 17. The resulting structure is shown in FIG. 5, wherein a sidewall of wafer 30 is recessed laterally from the respective edge of wafer 20. In FIG. 5 and subsequent figures, it is shown that one edge of the device wafer 30 is trimmed. In reality, the trimmed edge is circular, which mean all of the circular edge may be trimmed. In accordance with some embodiments, the trimmed width W1 may be in the range between about 2 mm and about 4 mm. Furthermore, in the trimming process, a top portion of the substrate 22 may be trimmed to form recess 60, which extends into substrate 22. The depth D1 of recess 60 may be in the range between about 50 μm and about 200 μm. Recess 60 forms a recess ring encircling the top portion of substrate 22.

In a subsequent process, substrate 32 may further be thinned. In accordance with alternative embodiments, the further thinning of substrate 32 is omitted. In accordance with some embodiments, substrate 32 is thinned in a dry etching process, which may be an anisotropic etching process or an isotropic etching process. In accordance with alternative embodiments, the etching may be performed through a dry etching process followed by a wet etching process. For example, the dry etching process may be performed using an etching gas including fluorine ($F_2$), Chlorine ($Cl_2$), hydrogen chloride (HCl), hydrogen bromide (HBr), Bromine ($Br_2$), $C_2F_6$, $CF_4$, $SO_2$, the mixture of HBr, $Cl_2$, and $O_2$, or the mixture of HBr, $Cl_2$, $O_2$, and $CH_2F_2$ etc. The wet etching process, if any, may be performed using KOH, tetramethylammonium hydroxide (TMAH), $CH_3COOH$, $NH_4OH$, $H_2O_2$, Isopropanol (IPA), the solution of HF, $HNO_3$, and $H_2O$, or the like.

In accordance with alternative embodiments, the thinning of substrate 32 may be performed through a CMP process or a mechanical grinding process. In the embodiments in which through-vias 65 (FIG. 8) have been formed previously to extend into semiconductor substrate 32, the through-vias 65 will be exposed by the thinning process.

Figure 6:
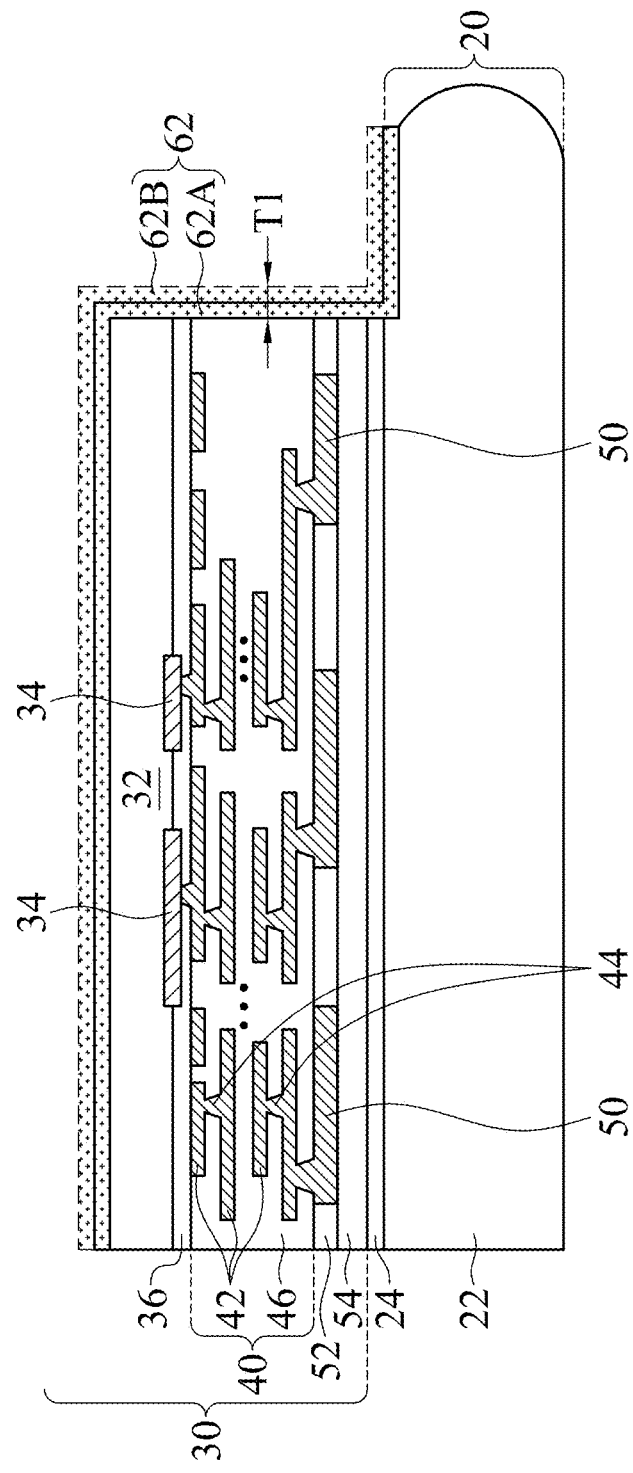

FIG. 6 illustrates the formation of sidewall protection layer 62, which is also an isolation layer. The respective process is illustrated as process 214 in the process flow 200 as shown in FIG. 17. The material of sidewall protection layer 62 may have a high density, for example, higher than the density of silicon oxide, which may be around 2.65 g/cm³. Furthermore, the material of sidewall protection layer 62 may include a metal compound such as a metal oxide and/or a metal nitride to further improve its density and its blocking ability. The density of sidewall protection layer 62 may be higher than about 2.7 g/cm³, and may be in the range between 2.7 g/cm³ and about 12.0 g/cm³. For example, silicon nitride has a density of about 3.17 g/cm³, tungsten oxide has a density of about 7.16 g/cm³, and hafnium oxide has a density of about 9.7 g/cm³. The dense sidewall protection layer 62 allows it to have good ability for preventing detrimental chemicals and moisture from penetrating through to reach and degrade low-k dielectric layers and metal features in device wafer 30.

In accordance with some embodiments, sidewall protection layer 62 may be formed of a material that can be expressed as $M_wO_xN_yC_z$, wherein values w, x, y, and z are relative atomic numbers, with the sum of values w, x, y, and z equal to 1.0. The element M may be selected from Si, Al, Ti, Zr, Hf, W, or the like, or combinations thereof. Each of values w, x, y, and z may be smaller than about 0.9, and may be in the range between about 0.1 and about 0.9. The thickness T1 is also related to the blocking ability of sidewall protection layer 62, with denser sidewall protection layer 62 being thinner, while less-denser sidewall protection layer 62 is formed thicker. In accordance with some embodiments, the thickness T1 of sidewall protection layer 62 is in the range between about 3 nm and about 1,000 nm.

In accordance with some embodiments, sidewall protection layer 62 may be formed of a metal compound as aforementioned, and/or may be formed of or comprising SiN, SiON, SiC, SiCN, SiCO, AlO, AlN, or the like, compounds thereof, or multi-layers thereof. In accordance with some embodiments, when values x, y, and z are equal to zero, sidewall protection layer 62 may also be a silicon layer or a metal layer, with the metal selected from the aforementioned list. When being a silicon layer or a metal layer, the atomic percentage of the Si or metal may be greater than about 90 percent or 95 percent.

In accordance with some embodiments, sidewall protection layer 62 is a single layer, with the entire sidewall protection layer 62 being formed of a homogeneous material, which may be selected from the above-recited materials. In accordance with alternative embodiments, sidewall protection layer 62 has a multi-layer structure including a plurality of sub layers. For example, FIG. 6 illustrates an example dual-layer sidewall protection layer 62 including sub layer 62A and upper sub layer 62B. Sidewall protection layer 62 may also include more than two sub layers such as three sub layers, four sub layers, or more. The compositions of the sub layers are different from each other. When two sub layers are referred to as having different compositions, it means that one of the two sub layers either has at least one element not in the other sub layer, or the two sub layers have the same elements, but the percentages of the elements in two sub layers are different from each other.

In accordance with some embodiments, the lower sub layer 62A has good adhesion to carrier wafer 20 and device wafer 30, and has better adhesion to carrier wafer 20 and device wafer 30 than the respective upper sub layer(s) such as upper sub layer 62B. In accordance with some embodiments, the lower sub layer 62A has higher nitrogen atomic percentage than the respective upper layer(s). With the higher nitrogen atomic percentage, the adhesion is improved. For example, the lower sub layer 62A may be expressed as $Ma_{w1}O_{x1}N_{y1}C_{z1}$, and the upper sub layer 62B may be expressed as $Mb_{w2}O_{x2}N_{y2}C_{z2}$, wherein value y1 is greater than value y2. Value x2 may be greater than value x1 so that the upper layer has better blocking ability than the lower layer, while value x2 may also be equal to or smaller than value x1. Each of the elements Ma and Mb may be selected from Si, Al, Ti, Zr, Hf, W, or the like, or combinations thereof. Furthermore, element Ma may be the same as or different from element Mb.

In accordance with some embodiments in which sidewall protection layer 62 has a multi-layer structure, each of or some of the lower sub layer (such as 62A) and upper sub layer (such as 62B) has a uniform composition, which means that when deposited, the atomic percentages of the elements in these sub layers are uniform, and the flow rates of the corresponding precursors are uniform. In accordance with alternative embodiments, when a lower sub layer and an upper sub layer that are in contact with each other, the lower portion of the lower sub layer may be formed as having a uniform composition, while the upper portion of the lower sub layer may be formed as having a gradually changed composition gradually transitioning from the composition of the lower portion of the lower sub layer to the composition of the upper sub layer. For example, when the lower portion of the sub layer 62A is formed of $M_wO_{x1}N_{y1}C_z$, and the upper sub layer is formed of $M_wO_{x2}N_{y2}C_{z2}$, the upper portion of the lower sub layer 62A may have a gradually reduced nitrogen atomic percentage and/or a gradually increased oxygen atomic percentage. During the proceeding of the deposition of the upper portion of the lower sub layer, the flow rate of the nitrogen-containing precursor is gradually reduced, and the flow rate of the oxygen-containing precursor for depositing the upper sub layer 62B may be gradually increased, until at a point, the upper sub layer 62B starts to be deposited.

In accordance with some embodiments, sidewall protection layer 62 is formed using a conformal deposition process such as CVD, ALD, or the like. The process conditions may be adjusted to further increase the density of the resulting sidewall protection layer 62. For example, the deposition rate of sidewall protection layer 62 may be reduced to make sidewall protection layer 62 denser. This may be achieved by reducing the flow rate of the precursors and/or the pressure in the deposition chamber. The temperature of device die 30 and carrier wafer 20 may also be increased to reduce the deposition rate and to increase the density of sidewall protection layer 62. In accordance with some embodiments, the deposition temperature is in the range between about 25° C. and about 450° C., and may be in the range between about 350° C. and about 450° C. The chamber pressure may be in the range between about 5 milli-torr and about 50 torr.

In accordance with some embodiments, to achieve the difference between the sub layers, the process conditions may be adjusted, so that the upper sub layers and lower sub layers are different from each other. In accordance with some embodiments, in the deposition of a lower sub layer, a first pressure is used to achieve a first deposition rate. In the deposition of a corresponding upper sub layer, a second pressure different from the first pressure is used to achieve a second deposition rate different from the first deposition rate. The flow rates of the precursors for depositing the lower sub layer may be the same as the corresponding precursors for depositing the upper sub layer. Accordingly, the upper sub layer and the lower sub layer may have a same composition, while the density of the upper sub layer may be different from (such as greater than or lower than) the lower sub layer.

Figure 7:
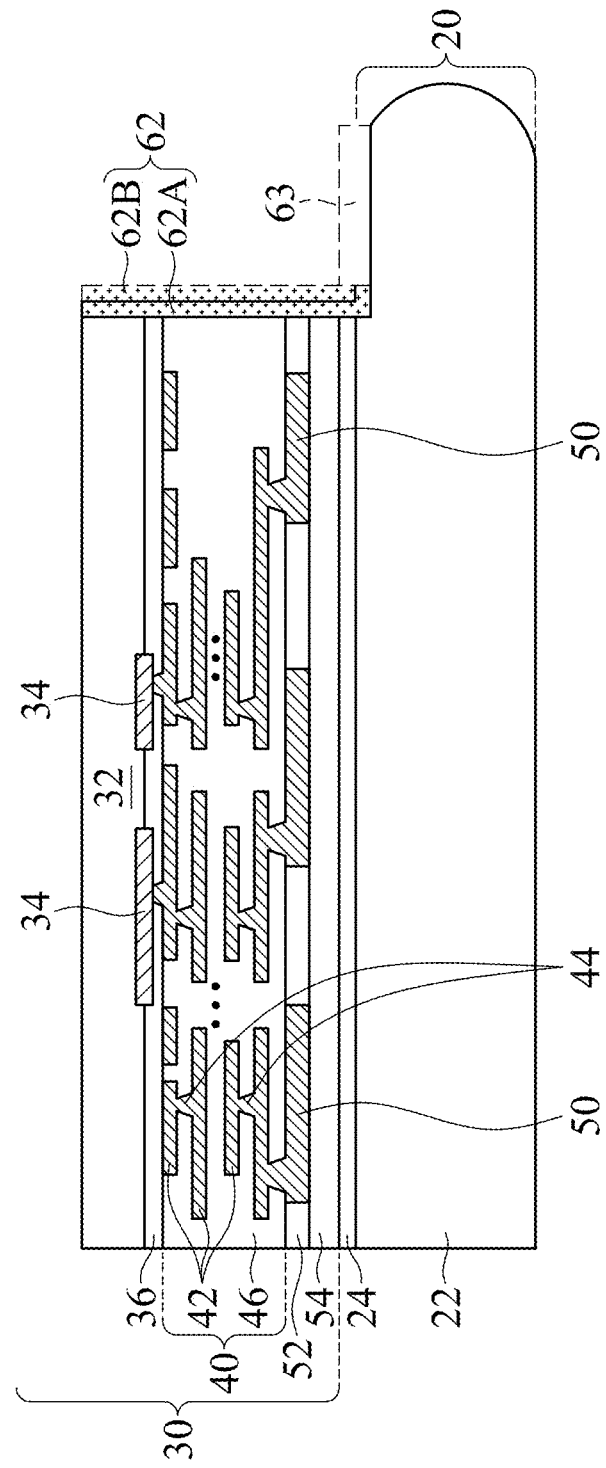

FIG. 7 illustrates the removal of the horizontal portions of sidewall protection layer 62, so that the top surface of device wafer 30 is exposed. The respective process is illustrated as process 216 in the process flow 200 as shown in FIG. 17. In accordance with some embodiments, a CMP process is performed to remove a first portion of sidewall protection layer 62 overlapping device wafer 30. An etching process may be performed to remove a second portion of sidewall protection layer 62 overlapping and contacting substrate 22 in carrier wafer 20. In accordance with alternative embodiments, the second portion of sidewall protection layer 62 is not removed, and is left on carrier wafer 20. Dashed region 63 is illustrated to show that the second portion of sidewall protection layer 62 may or may not exist in this region. In accordance with alternative embodiments, the removal of the horizontal portions of sidewall protection layer 62 is performed through one or a plurality of anisotropic etching processes. In accordance with these embodiments, both of the horizontal portions of sidewall protection layer 62 overlapping device wafer 30 and the horizontal portions of sidewall protection layer 62 overlapping carrier wafer 20 are removed.

The remaining sidewall protection layer 62 forms a full ring encircling, and contacting, device wafer 30. Sidewall protection layer 62 has the function of preventing the peeling of the layers in device wafer 30. Also, sidewall protection layer 62 prevent moisture and oxygen from penetrating into device wafer 30 from their sidewalls.

Referring to FIG. 8, dielectric layer 64 is formed, for example, through a conformal deposition process, which may be an ALD process, a CVD process, or the like. The respective process is illustrated as process 218 in the process flow 200 as shown in FIG. 17. In accordance with some embodiments, dielectric layer 64 is formed of or comprises silicon oxide, silicon nitride, silicon oxynitride, or the like. Through-vias 65 may be formed to penetrate through substrate 32, and electrically connecting to integrated circuit devices 34. The formation process may include etching dielectric layer 64 and substrate 32 to form through-openings. The etching may be stopped on the metal pads in interconnect structure 40. Next, an isolation layer is formed to encircle each of the through-openings. The formation process may include depositing a conformal dielectric layer extending into the through-openings, and then performing an anisotropic etching process to re-expose the metal pads. A conductive material(s) is then deposited to fill the through-openings, followed by a planarization process to remove excess conductive materials outside of the through-openings. The remaining portions of the conductive material(s) are through-vias 65. The respective process is illustrated as process 220 in the process flow 200 as shown in FIG. 17.

In accordance with alternatively embodiments, the through-vias 65 have been formed previously (for example, in the process shown in FIG. 1). Accordingly, in the process shown in FIG. 8, a backside grinding process and an etch-back process may be performed on substrate 32, so that the top portions of through-vias 65 protrude higher than the recessed top surface of substrate 32. Dielectric layer 64 is then deposited, followed by a light CMP process to re-expose through-vias 65.

As shown in FIG. 8, dielectric layer 64 may extend on the outer sidewalls of sidewall protection layer 62. Dielectric layer 64 may further extend on and contacting the top surface of substrate 22. Conversely, dielectric layer 64 extends on, and contacting the top surface of the horizontal portions of sidewall protection layer 62 in dashed region 63 (FIG. 7) when these portions of sidewall protection layer 62 are not removed.

Figure 9:
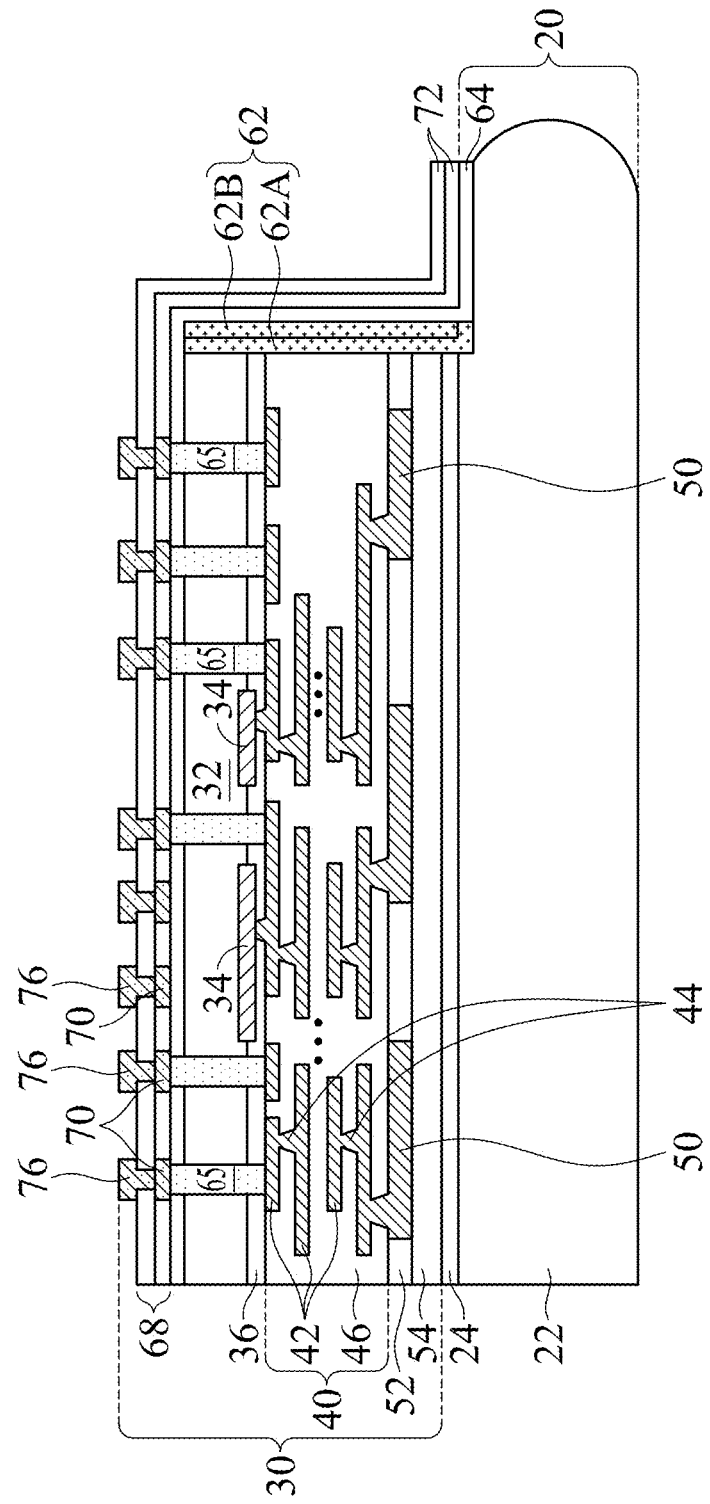

Referring to FIG. 9, backside interconnect structure 68 is formed, which includes one or a plurality of dielectric layers 72 and one or a plurality of layers of redistribution lines (RDLs) 70. The respective process is illustrated as process 222 in the process flow 200 as shown in FIG. 17. In accordance with some embodiments, RDLs 70 are formed through damascene processes, which include depositing the corresponding dielectric layers 72, forming trenches and via openings in the dielectric layers 72, and filling the trenches and via openings with a metallic material(s) to form RDLs 70. Dielectric layers 72 may be formed of or comprise inorganic dielectric materials such as silicon oxide, silicon nitride, silicon oxynitride, or the like.

In accordance with alternative embodiments, dielectric layers 72 may be formed of polymers, which may be photo-sensitive, and the formation process of an RDL layer may include depositing a metal seed layer, forming and patterning a plating mask over the metal seed layer, performing a plating process to form the RDLs, removing the plating mask to expose the underlying portions of the metal seed layer, and etching the exposed portions of the metal seed layer.

In accordance with some embodiments, electrical connectors 76 are formed on the back surface of device wafer 30. Electrical connectors 76 may include metal bumps, metal pads, solder regions, or the like. In accordance with some embodiments, electrical connectors 76 protrude higher than the top surface of surface dielectric layer 72. In accordance with alternative embodiments, the top surface of electrical connectors 76 are coplanar with the dielectric layer 72.

Figure 10:
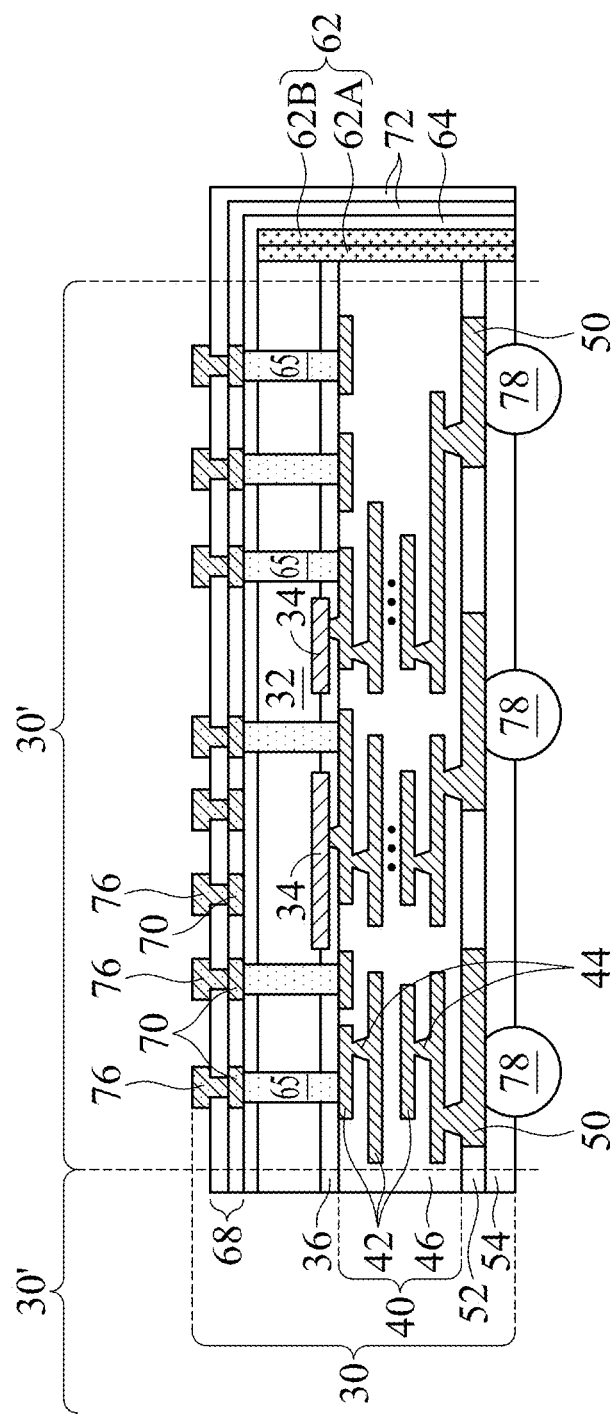

In accordance with some embodiments, carrier wafer 20 is removed. The respective process is illustrated as process 224 in the process flow 200 as shown in FIG. 17. In accordance with some embodiments, the top side of the structure shown in FIG. 9 is adhered to a tape, and the structure is flipped upside down. Substrate 22 is then removed, which may be through a CMP process, a mechanical grinding process, an etching process, or combinations thereof. Bond layer 24 may be removed, or may be left un-removed. When bond layer 24 is removed, bond layer 54 will be exposed. FIG. 10 illustrates a resulting structure.

As also shown in FIG. 10, electrical connectors 78 are formed on the front side of device wafer 30. The respective process is illustrated as process 226 in the process flow 200 as shown in FIG. 17. The formation process may include etching bond layer 54 to form openings, so that metal pads 50 are exposed, and forming electrical connectors 78 extending into the openings to electrically connect to metal pads 50.

In accordance with some embodiments, device wafer 30 may be singulated in a die-saw process to form discrete device dies 30'. Sidewall protection layer 62 is removed by the die-saw process, and does not exist in the resulting device dies 30'. In accordance with alternative embodiments, another device wafer is bonded to wafer 30 to form a reconstructed wafer, which is singulated to separate device dies 30' from each other, with each of the device dies 30' being bonded with another device die in the other wafer.

Figure 11:
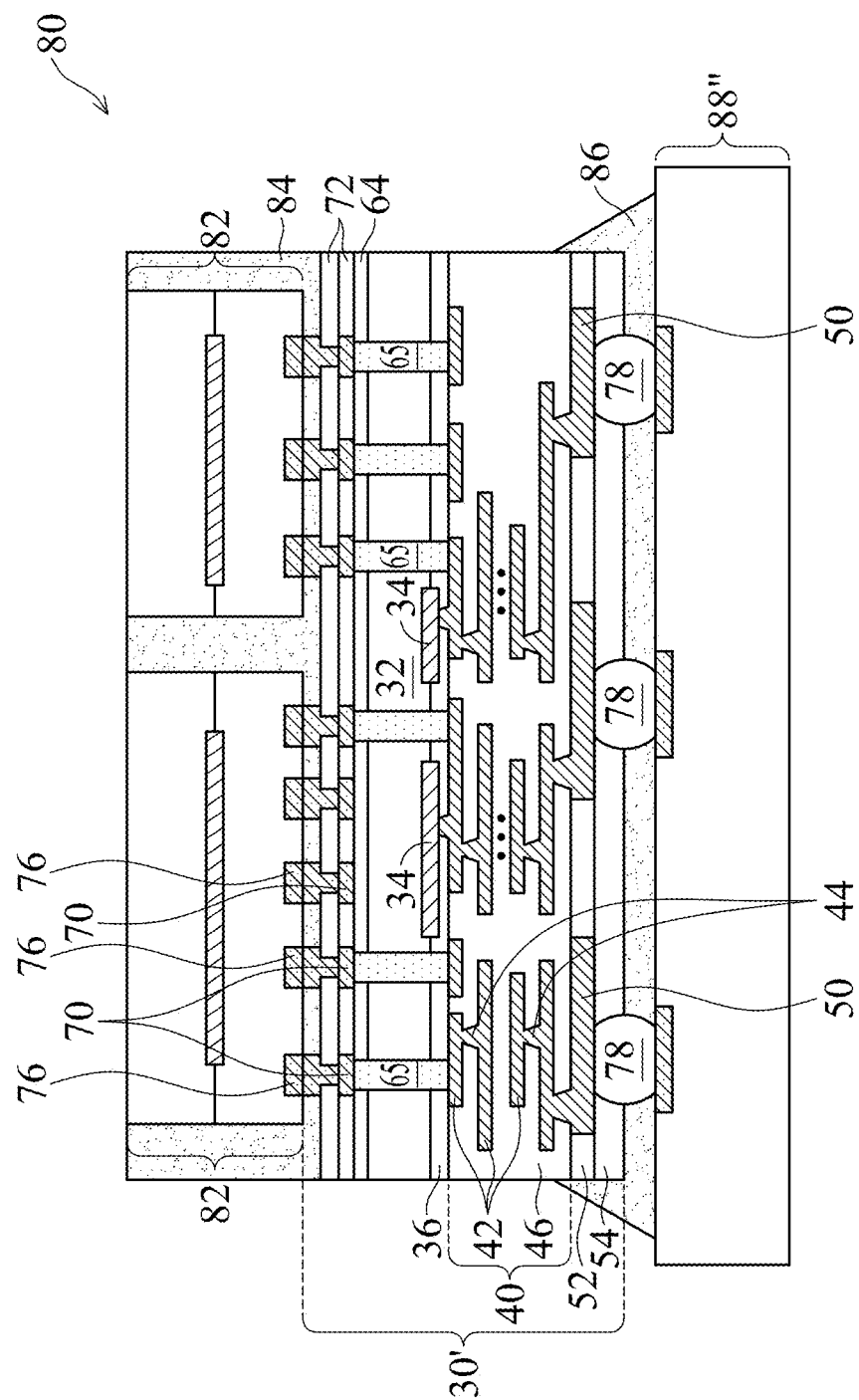

FIG. 11 illustrates a package 80 including device die 30' bonded with device dies 82. The respective process is illustrated as process 228 in the process flow 200 as shown in FIG. 17. Encapsulant 84 may be dispensed to encapsulate device dies 82. Encapsulant 84 may be a molding compound, a molding underfill, or the, like. Package component 88 is bonded to device die 30'. Package component 88 may be a printed circuit board, a package substrate, or the like. Underfill 86 may be disposed between device die 30' and package component 88.

In accordance with alternative embodiments, device dies 82, instead of being bonded to the device dies 30' after the removal of substrate 22 (FIG. 9), are bonded to the device dies 30' in un-sawed device wafer 30 before the removal of substrate 22. Accordingly, the device dies 82 as shown in FIG. 11 may be bonded to the structure shown in FIG. 9, followed by an encapsulation process to form a reconstructed wafer, which includes carrier wafer 20, device wafer 30, device dies 82, and encapsulant 84 (FIG. 11). The subsequent process may then be performed to form the structure shown in FIG. 11.

Figure 12:
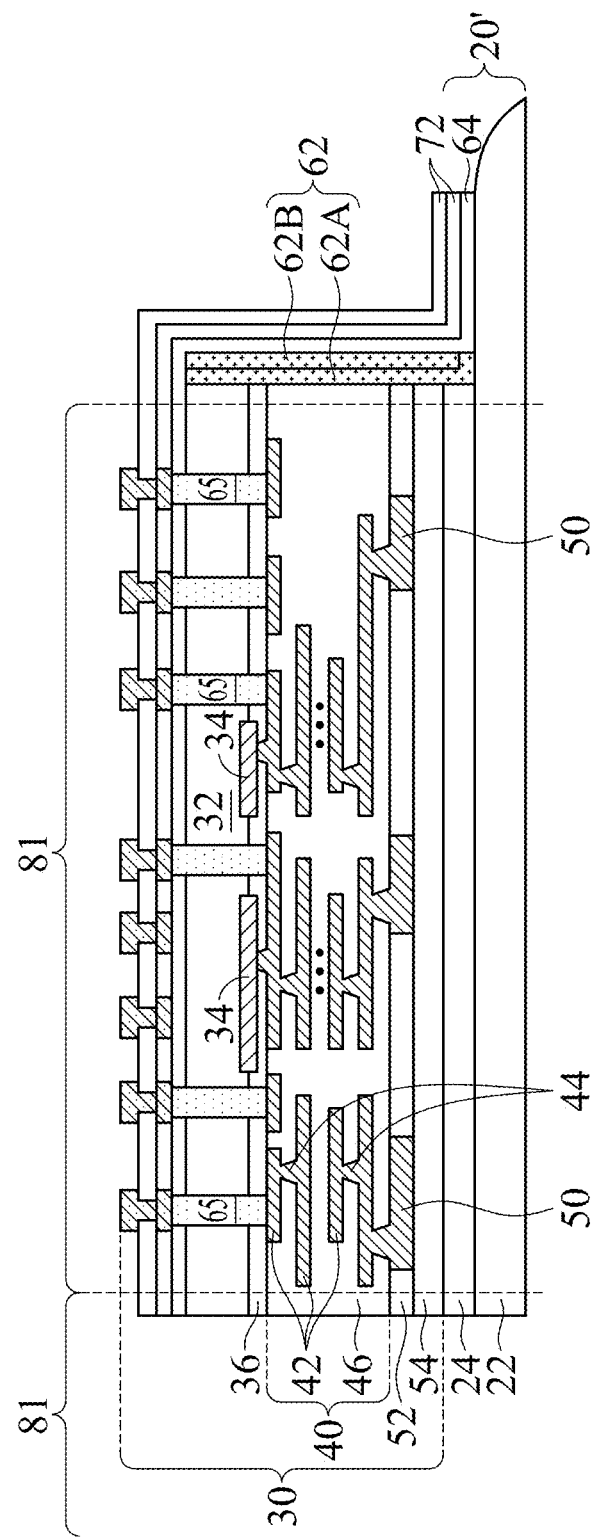
FIGS. 12-14 illustrate the intermediate stages in a wafer bonding process and the formation of a package in accordance with some embodiments.
Figure 13:
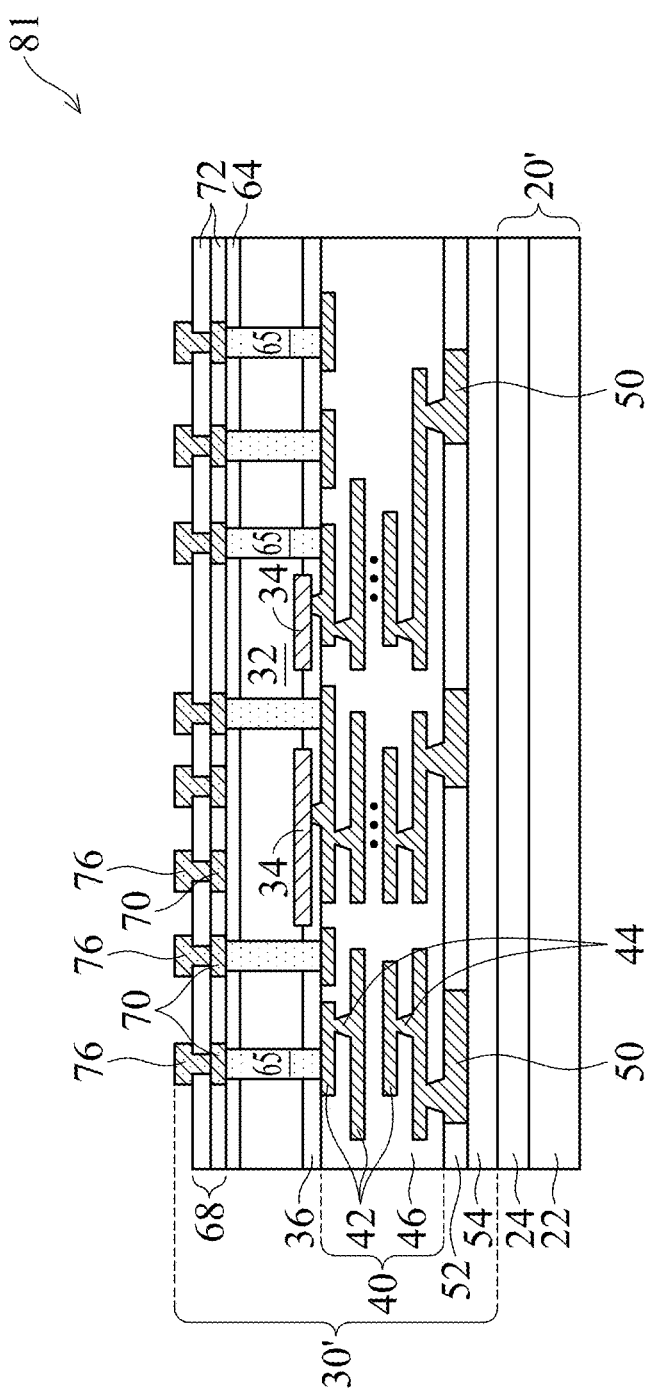
Figure 14:
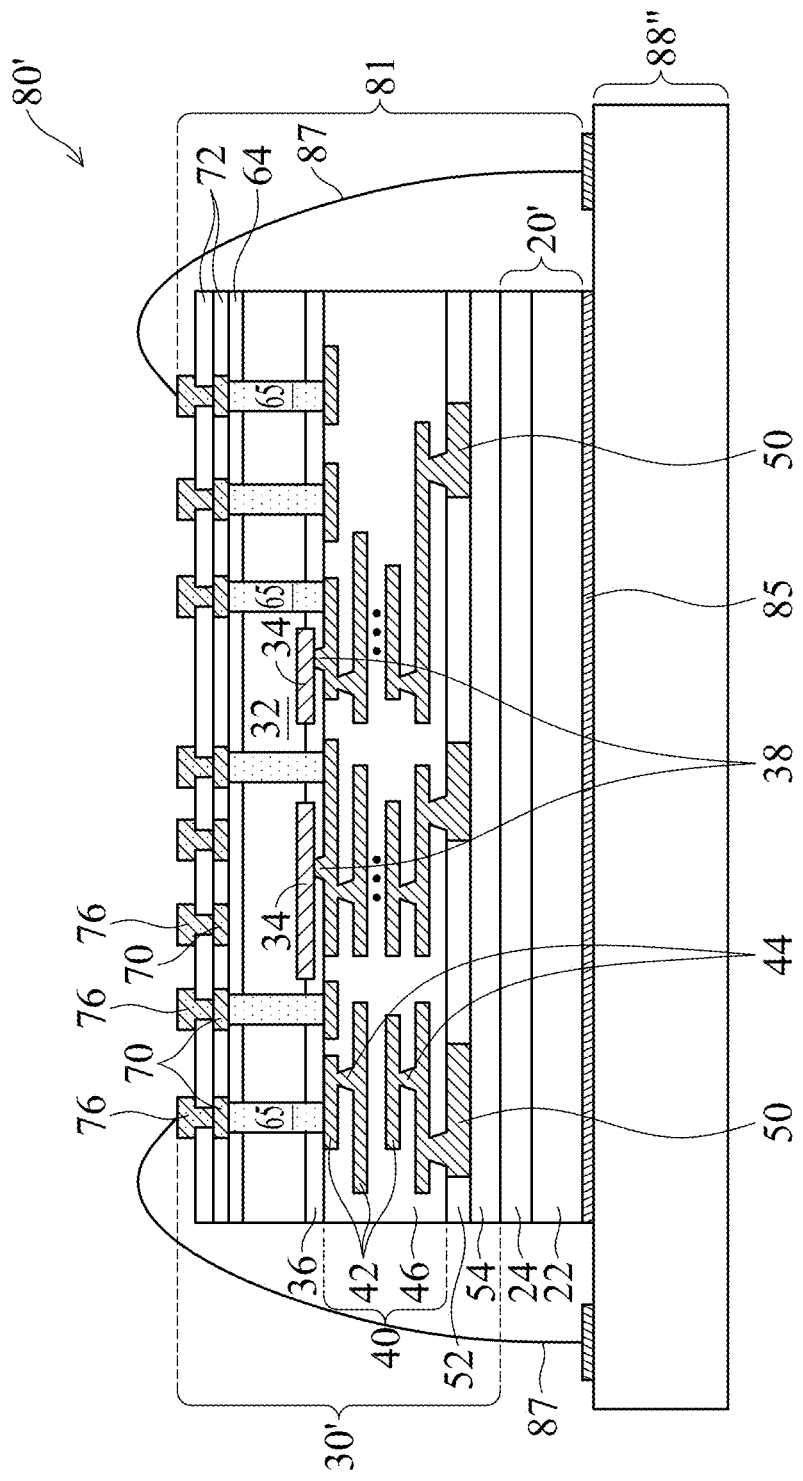

FIGS. 12 through 14 illustrate the cross-sectional views of intermediate stages in the formation of a package in accordance with alternative embodiments of the present disclosure. These embodiments are similar to the embodiments shown in FIGS. 1 through 11, except that instead of bonding device dies to the front side of the device die 30', a package component is attached to the backside of the device die 30', and the substrate 22 of the carrier wafer/die is not fully removed. Unless specified otherwise, the materials and the formation processes of the components in these embodiments are essentially the same as the like components, which are denoted by like reference numerals in the preceding embodiments shown in FIGS. 1 through 11. The details regarding the formation processes and the materials of the components shown in FIGS. 12 through 14 may thus be found in the discussion of the preceding embodiments.

The initial processes of these embodiments are essentially the same as shown in FIGS. 1 through 9. Next, as shown in FIG. 12, substrate 22 is thinned, for example, through a CMP process or a mechanical grinding process.

In accordance with some embodiments, device wafer 30 and substrate 22 may be singulated in a die-saw process to form discrete packages 81, each comprising one of device dies 30' and a portion of substrate 22. Sidewall protection layer 62 is removed by the die-saw process, and does not exist in the resulting packages 81. FIG. 13 illustrates one of the resulting packages 81.

FIG. 14 illustrates the formation of package 80 in accordance with alternative embodiments. It is appreciated that package 80 may be packaged differently than shown in FIG. 14. Package 81 may be attached to package component 88' through Thermal Interface Material (TIM) 85 or a die-attach film. In accordance with some embodiments, device die 30' is electrically connected to package components 88 through bond wires 87.

Figure 15:
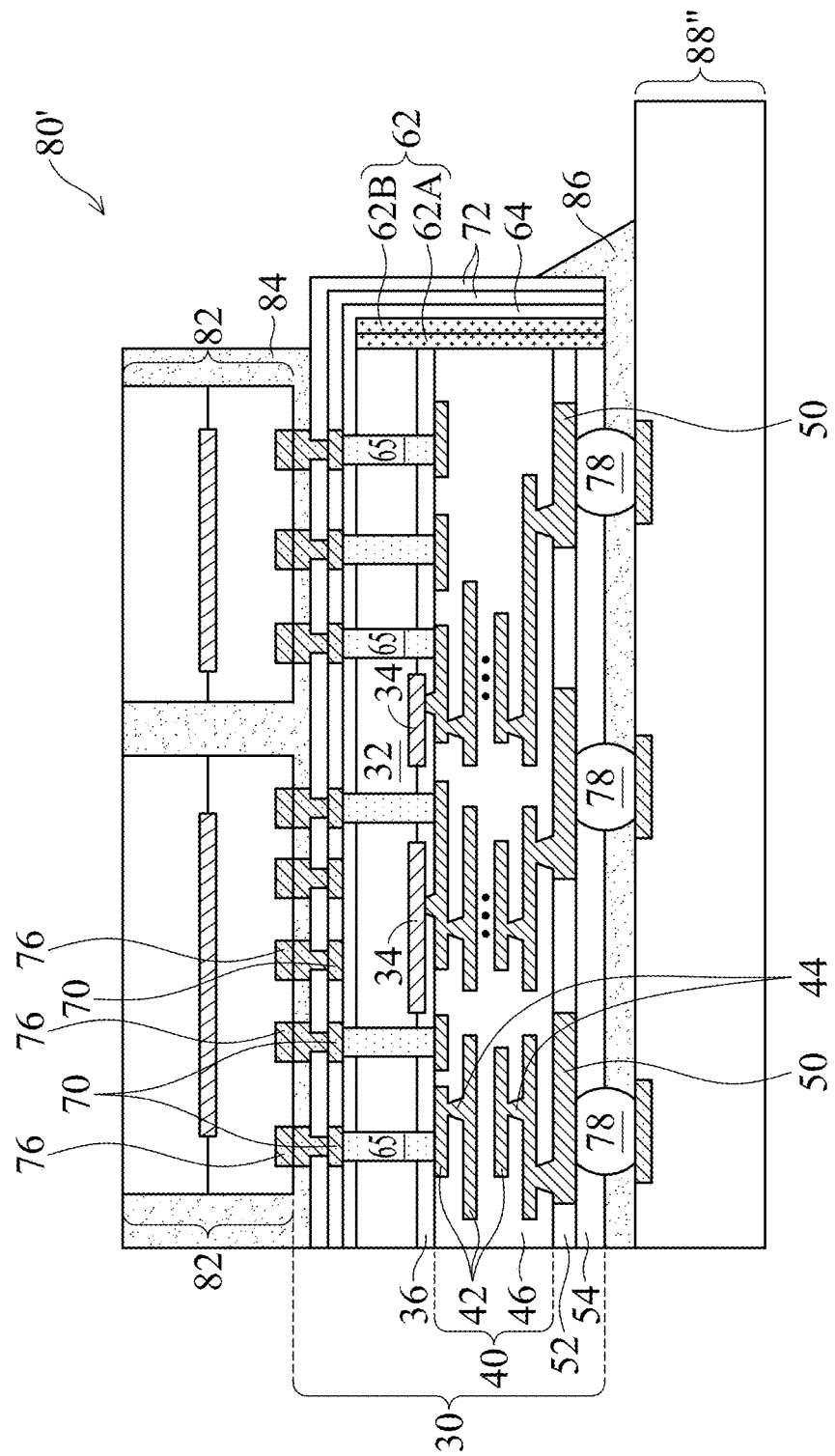
FIGS. 15 and 16 illustrate the cross-sectional views of wafer-level packages in accordance with some embodiments.

FIG. 15 illustrates a structure in which a wafer-level package 80' is formed. In the wafer-level packaging, device wafer 30 is not sawed, and is used as having the wafer shape. Device wafer 30 includes semiconductor substrate 32. This embodiment may be used in some high-performance applications such as in Artificial Intelligence (AI) applications. Device wafer 30 is bonded to wafer 88", for example, through solder regions 78. Underfill 86 may be dispensed. Alternatively, device wafer 30 may be bonded to wafer 88" through wafer-level hybrid bonding. As shown in FIG. 15, sidewall protection layer 62 may be left in the final structure. Sidewall protection layer 62 may form a full ring fully encircling device wafer 30.

Figure 16:
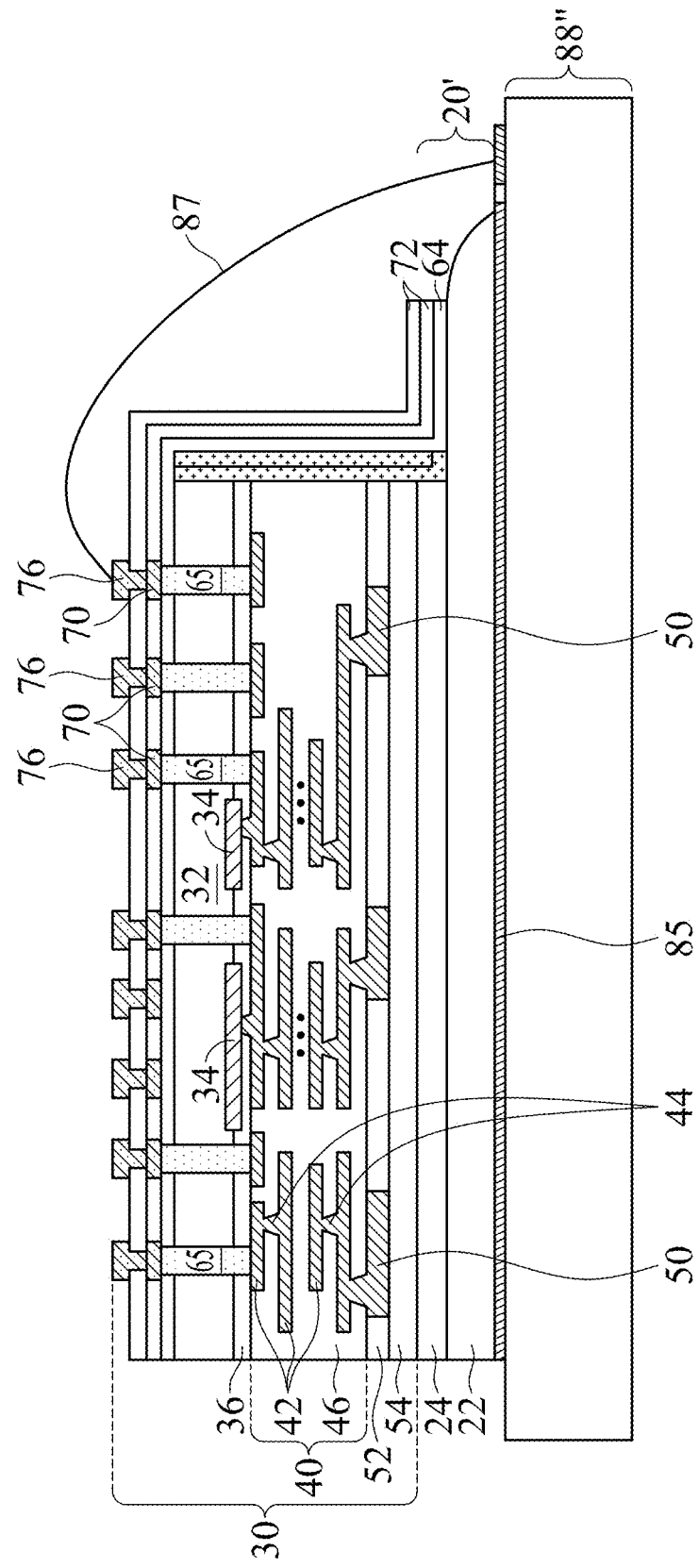

In accordance with some embodiments as shown in FIG. 15, the substrate 22 of carrier wafer 20 is removed. In accordance with alternative embodiments, as shown in FIG. 16, substrate 22 is thinned, and package component 88''' is attached underlying substrate 22, which is a part of the un-sawed wafer 20.

The embodiments of the present disclosure have some advantageous features. By forming a sidewall protection layer that is dense (denser than silicon oxide), the sidewall protection layer may effectively block oxygen and moisture from penetrating into the device wafer in subsequent processes. Accordingly, the oxygen-and-moisture isolation ability of the sidewall protection layer is improved.

In accordance with some embodiments of the present disclosure, a method includes bonding a first wafer to a second wafer; performing a trimming process on the first wafer, wherein an edge portion of the first wafer is removed; depositing a sidewall protection layer contacting a sidewall of the first wafer, wherein the depositing the sidewall protection layer comprises depositing a high-density material in contact with the sidewall of the first wafer, and wherein the sidewall protection layer has a density higher than a density of silicon oxide; removing a horizontal portion of the sidewall protection layer that overlaps the first wafer; and forming an interconnect structure over the first wafer, wherein the interconnect structure is electrically connected to integrated circuit devices in the first wafer. In an embodiment, the depositing the sidewall protection layer comprises depositing a metal-containing dielectric layer. In an embodiment, the metal-containing dielectric layer comprises a metal selected from aluminum, titanium, zirconium, hafnium, tungsten, and combinations thereof. In an embodiment, the depositing the sidewall protection layer includes depositing a first sub layer formed of a first material; and depositing a second sub layer on the first sub layer, wherein the second sub layer is formed of a second material different from the first material. In an embodiment, the depositing the second sub layer comprises depositing a first metal-containing layer comprising a first metal. In an embodiment, the depositing the first sub layer comprises depositing a second metal-containing layer comprising a second metal different from the first metal. In an embodiment, the method further comprises, between the depositing the first sub layer and the depositing the second sub layer, depositing a third sub layer, wherein during the depositing the third sub layer, process gases gradually transition from first precursors for depositing the first sub layer to second precursors for depositing the second sub layer. In an embodiment, an entirety of the sidewall protection layer comprises the high-density material. In an embodiment, the method further comprises, after the interconnect structure is formed, removing the second wafer from the first wafer. In an embodiment, the method further comprises performing a singulation process on the first wafer to separate the first wafer into a plurality of device dies. In an embodiment, the plurality of device dies are free from portions of the sidewall protection layer. In an embodiment, the method further comprises bonding the first wafer to a wafer-level package component; and disposing an underfill between the first wafer and the wafer-level package component, wherein the underfill physically contacts the sidewall protection layer.

In accordance with some embodiments of the present disclosure, a method includes bonding a device wafer over a carrier wafer; thinning a semiconductor substrate of the device wafer; trimming the device wafer, wherein an edge portion of the device wafer is trimmed; depositing a sidewall protection layer on the device wafer and the carrier wafer, wherein the depositing the sidewall protection layer comprises depositing a metal-containing layer; revealing a top surface of the device wafer; and forming an interconnect structure over the device wafer, wherein the interconnect structure is electrically connected to integrated circuit devices in the device wafer. In an embodiment, the sidewall protection layer comprises a metal selected from aluminum, titanium, zirconium, hafnium, tungsten, and combinations thereof. In an embodiment, the depositing the sidewall protection layer comprises depositing a first sub layer; and depositing a second sub layer on the first sub layer, wherein the first sub layer has a higher nitrogen atomic percentage than the second sub layer. In an embodiment, the second sub layer has a higher oxygen atomic percentage than the second sub layer. In an embodiment, the method further comprises depositing a transition layer between the first sub layer and the second sub layer, wherein in the depositing the transition layer, process conditions gradually transition from process conditions for forming the first sub layer to process conditions for forming the second sub layer.

In accordance with some embodiments of the present disclosure, a method includes bonding a device wafer over a carrier wafer, wherein a first dielectric layer in the device wafer is bonded to a second dielectric layer in the carrier wafer; trimming the device wafer, wherein a portion of a first substrate in the device wafer is trimmed, and a top surface of a second substrate in the carrier wafer is exposed; depositing a sidewall protection layer on the device wafer and the carrier wafer, wherein the depositing the sidewall protection layer comprises depositing a material selected from the group consisting of a metal oxide, a metal nitride, a metal carbide, and combinations thereof; removing horizontal portions of the sidewall protection layer from the device wafer and the carrier wafer; removing at least a portion of the second substrate; and attaching a package component to the device wafer to form a wafer-level package, wherein the sidewall protection layer exists in the wafer-level package. In an embodiment, the depositing the sidewall protection layer comprises depositing a metal-containing material. In an embodiment, the depositing the sidewall protection layer comprises depositing a metal compound, wherein the metal compound comprises a metal selected from aluminum, titanium, zirconium, hafnium, tungsten, and combinations thereof.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    bonding a first wafer to a second wafer;
    performing a trimming process on the first wafer, wherein an edge portion of the first wafer is removed;
    depositing a sidewall protection layer contacting a sidewall of the first wafer, wherein the depositing the sidewall protection layer comprises depositing a high-density material in contact with the sidewall of the first wafer, and wherein the sidewall protection layer has a density higher than a density of silicon oxide;
    removing a horizontal portion of the sidewall protection layer that overlaps the first wafer; and
    forming an interconnect structure over the first wafer, wherein the interconnect structure is electrically connected to integrated circuit devices in the first wafer.

2. The method of claim 1, wherein the depositing the sidewall protection layer comprises depositing a metal-containing dielectric layer.

3. The method of claim 2, wherein the metal-containing dielectric layer comprises a metal selected from aluminum, titanium, zirconium, hafnium, tungsten, and combinations thereof.

4. The method of claim 1, wherein the depositing the sidewall protection layer comprises:
    depositing a first sub layer formed of a first material; and
    depositing a second sub layer on the first sub layer, wherein the second sub layer is formed of a second material different from the first material.

5. The method of claim 4, wherein the depositing the second sub layer comprises depositing a first metal-containing layer comprising a first metal.

6. The method of claim 5, wherein the depositing the first sub layer comprises depositing a second metal-containing layer comprising a second metal different from the first metal.

7. The method of claim 4 further comprising, between the depositing the first sub layer and the depositing the second sub layer, depositing a third sub layer, wherein during the depositing the third sub layer, process gases gradually transition from first precursors for depositing the first sub layer to second precursors for depositing the second sub layer.

8. The method of claim 1, wherein an entirety of the sidewall protection layer comprises the high-density material.

9. The method of claim 1 further comprising, after the interconnect structure is formed, removing the second wafer from the first wafer.

10. The method of claim 1 further comprising performing a singulation process on the first wafer to separate the first wafer into a plurality of device dies.

11. The method of claim 10, wherein the plurality of device dies are free from portions of the sidewall protection layer.

12. The method of claim 1 further comprising:
    bonding the first wafer to a wafer-level package component; and
    disposing an underfill between the first wafer and the wafer-level package component, wherein the underfill physically contacts the sidewall protection layer.

13. A method comprising:
bonding a device wafer over a carrier wafer;
thinning a semiconductor substrate of the device wafer;
trimming the device wafer, wherein an edge portion of the device wafer is trimmed;
depositing a sidewall protection layer on the device wafer and the carrier wafer, wherein the depositing the sidewall protection layer comprises depositing a metal-containing layer;
revealing a top surface of the device wafer; and
forming an interconnect structure over the device wafer, wherein the interconnect structure is electrically connected to integrated circuit devices in the device wafer.

14. The method of claim 13, wherein the sidewall protection layer comprises a metal selected from aluminum, titanium, zirconium, hafnium, tungsten, and combinations thereof.

15. The method of claim 13, wherein the depositing the sidewall protection layer comprises:
depositing a first sub layer; and
depositing a second sub layer on the first sub layer, wherein the first sub layer has a higher nitrogen atomic percentage than the second sub layer.

16. The method of claim 15, wherein the second sub layer has a higher oxygen atomic percentage than the first sub layer.

17. The method of claim 15 further comprising depositing a transition layer between the first sub layer and the second sub layer, wherein in the depositing the transition layer, process conditions gradually transition from process conditions for forming the first sub layer to process conditions for forming the second sub layer.

18. A method comprising:
bonding a device wafer over a carrier wafer, wherein a first dielectric layer in the device wafer is bonded to a second dielectric layer in the carrier wafer;
trimming the device wafer, wherein a portion of a first substrate in the device wafer is trimmed, and a top surface of a second substrate in the carrier wafer is exposed;
depositing a sidewall protection layer on the device wafer and the carrier wafer, wherein the depositing the sidewall protection layer comprises depositing a material selected from the group consisting of a metal oxide, a metal nitride, a metal carbide, and combinations thereof;
removing horizontal portions of the sidewall protection layer from the device wafer and the carrier wafer;
removing at least a portion of the second substrate; and
attaching a package component to the device wafer to form a wafer-level package, wherein the sidewall protection layer exists in the wafer-level package.

19. The method of claim 18, wherein the depositing the sidewall protection layer comprises depositing a metal-containing material.

20. The method of claim 18, wherein the depositing the sidewall protection layer comprises depositing a metal compound, wherein the metal compound comprises a metal selected from aluminum, titanium, zirconium, hafnium, tungsten, and combinations thereof.

* * * * *